(12) United States Patent
Inlow (10) Patent No.: US 7,321,313 B1
(45) Date of Patent: Jan. 22, 2008

(54) ELECTRONIC INSERTION/EXTRACTION CYCLE COUNTER AND LOGGER DEVICE

(75) Inventor: Mark C. Inlow, Lisle, IL (US)

(73) Assignee: Tellabs Operations, Inc., Naperville, IL (US)

( * ) Notice: Subject to any disclaimer, the term of this patent is extended or adjusted under 35 U.S.C. 154(b) by 473 days.

(21) Appl. No.: 10/630,347

(22) Filed: Jul. 30, 2003

(51) Int. Cl.
*G08B 21/00* (2006.01)
(52) U.S. Cl. ............... 340/654; 340/686.1; 340/686.4; 340/687; 702/34; 702/187
(58) Field of Classification Search ........... 340/654, 340/686.1, 686.4, 687; 702/34, 187
See application file for complete search history.

(56) References Cited

U.S. PATENT DOCUMENTS

| | | | |
|---|---|---|---|
| 4,322,966 A | 4/1982 | Golabek | |
| 5,313,938 A | 5/1994 | Garfield et al. | |
| 5,359,993 A | 11/1994 | Slater et al. | |
| 5,383,874 A | 1/1995 | Jackson et al. | |
| 5,400,267 A | 3/1995 | Denen et al. | |
| 5,452,335 A | 9/1995 | Slater et al. | |
| 5,991,355 A | 11/1999 | Dahlke | |
| 6,662,119 B1 * | 12/2003 | Mitchell | ..................... 702/34 |
| 6,815,650 B1 | 11/2004 | Bartz | |

FOREIGN PATENT DOCUMENTS

DE          198 25 754 A1       1/1999

* cited by examiner

*Primary Examiner*—Tai Nguyen
(74) *Attorney, Agent, or Firm*—Hamilton, Brook, Smith & Reynolds, P.C.

(57) ABSTRACT

A monitoring system monitors wear of a connector by counting insertions or extractions between circuit boards. The monitoring system includes a sensor that senses insertions or extractions through contact or non-contact sensing. The monitoring system also includes a monitor connected to the sensor to monitor insertions or extractions and, optionally, store data in memory and generate an alarm signal if a predetermined threshold has been exceeded. The monitoring system may be positioned at any location in an electronic system and may be configured such that the sensor connects to the monitor directly, indirectly, or over a network.

28 Claims, 8 Drawing Sheets

ELECTRONIC INSERTION/EXTRACTION CYCLE COUNTER AND LOGGER DEVICE

BACKGROUND OF THE INVENTION

Many electronic systems are assembled through the use of electrical or optical connectors, such as circuit board to circuit board connectors, cable to circuit board connectors, and cable to cable connectors. Connectors typically include a plug part and socket part, which interconnect. In certain applications, the plug part of the connector is inserted and extracted many times from the socket part of the connector. For example, when testing a circuit board product, a manufacturer inserts and extracts many circuit boards from a single test interface connector. Over time, the connector's sockets wear out and the electrical connection between any given circuit board and the test interface degrades. The effects on testing are detrimental. Instead of detecting failures in a circuit board product, the testing interface may incorrectly detect a failure as a result of a poor electrical or optical connection in a connector. As a result, manufacturers suffer from decreased yield when they discard circuit boards that fail testing procedures because of a poor electrical connection. In other applications, systems or networks may experience failures due to regular maintenance of the systems that includes unplugging and re-plugging circuit boards or cables.

SUMMARY OF THE INVENTION

The present invention addresses the connector wear problem by monitoring insertions or extractions associated with wear of the connector. Accordingly, a monitoring system of the present invention includes a sensor and a monitor. The sensor may sense insertions or extractions through contact sensors, e.g., through a spare pin or a mechanical switch, or non-contact sensors, e.g., through optical or capacitive means. The monitor connects to the sensor to monitor the wear of the connector based on sensed insertions or extractions. By monitoring connector wear, the connector may be replaced at an appropriate time prior to experiencing the effects of a poor electrical or optical connection.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

A description of preferred embodiments of the invention follows.

Figure 1:
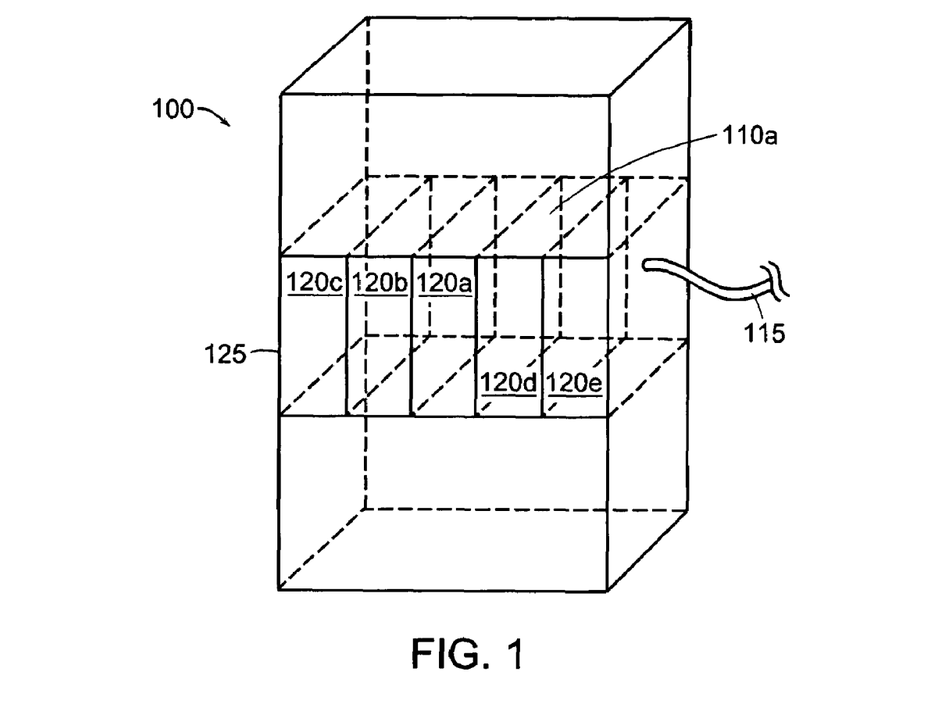
FIG. 1 is a perspective view of an electronic system employing a connector wear monitoring system according to the principles of the present invention.

FIG. 1 illustrates an electronics system 100 that includes an electronics rack or shelf 125 of circuit boards 120a, 120b, . . . , 120e (collectively circuit boards 120). The electronics shelf 125 is assembled in part by inserting a second circuit board 120a into a first circuit board 110a. In other systems, such as desktop computers or circuit board test systems, the circuit board 120a is referred to as a daughter board 120a, and the backplane 110a may be a motherboard 110a.

In each case, a connector (not shown), such as a 64-pin or 96-pin DIN connector, is attached to each circuit board 110a and 120a. More specifically, a first part of a connector is attached to one circuit board 120a and a second part of the connector is attached to the other circuit board 110a. Other circuit boards 120b-120e connect to the backplane 110a in a similar manner.

Connectors are also found on cables, such as a cable 115 connecting at one end to the side of the backplane 110a opposite the side receiving the circuit boards 120. The cable 115 may be electrical or optical and have a corresponding connector, which includes first and second parts similar to the arrangement just described.

Figure 2A:
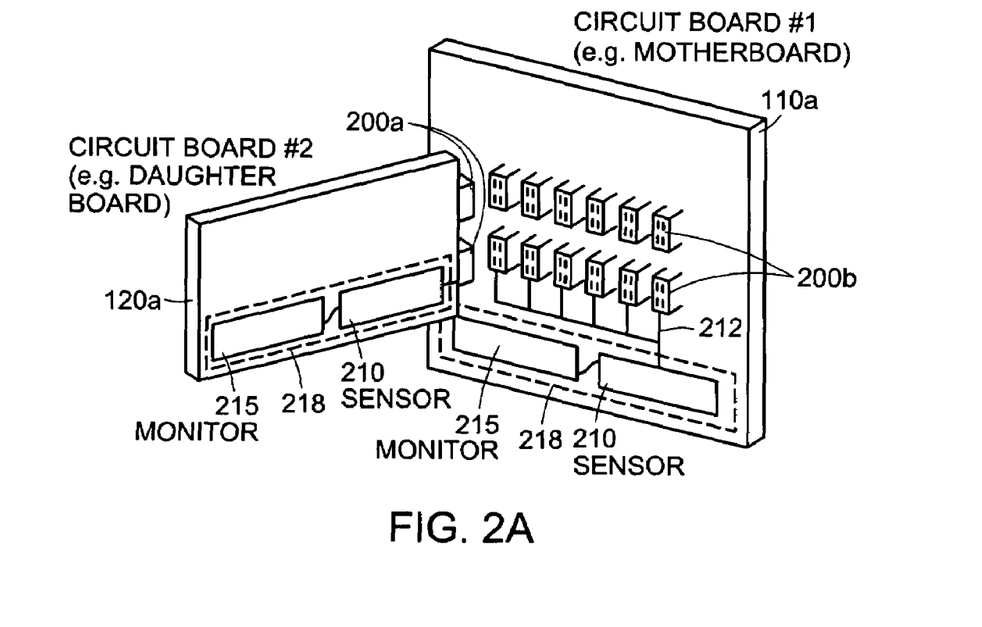
FIG. 2A is a schematic view of circuit boards of the system of FIG. 1 including an embodiment of the monitoring system including a sensor and monitor on each circuit board.

FIG. 2A is a close-up view of the circuit board 120a connecting to the backplane 110a in the manner discussed above. The circuit board 120a includes first parts 200a of the connectors, and the backplane 110a includes second parts 200b of the connectors. The first part 200a and second part 200b of the connector are hereinafter referred to collectively as the connector 200. The first part 200a may include pins (not shown) and the second part 200b may include sockets (not shown) designed to receive the pins in a manner designed to form a good electrical connection.

Figure 2B:
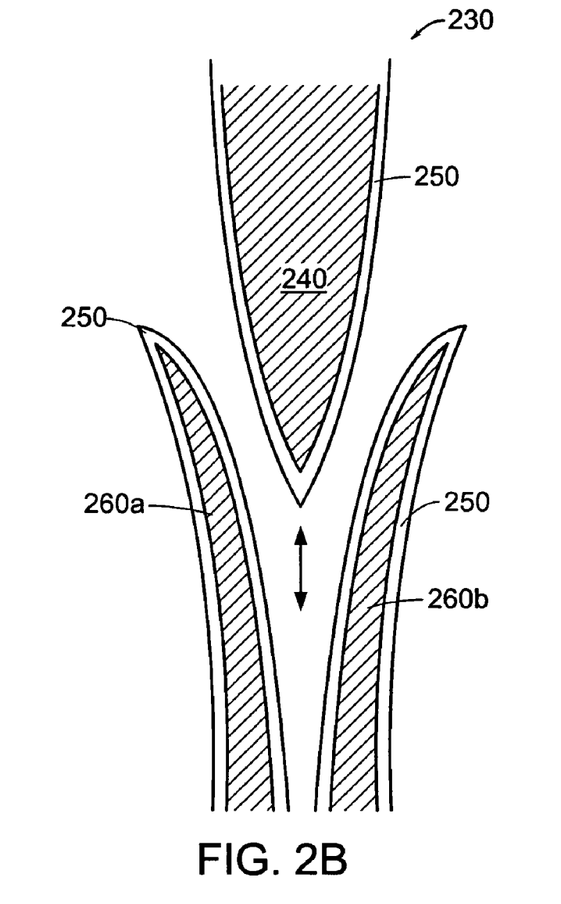
FIG. 2B is a close-up cross sectional view of a pin and socket in a connector of FIG. 2A.

Electrical connection between the second circuit board 120a and first circuit board 110a may be made through a pin and socket configuration 230 shown in FIG. 2B in which a pin 240 is inserted and held between a first part of the socket 260a and a second part of the socket 260b, together forming a socket 260. The first part 200a of the circuit board connector 200 shown in FIG. 2A houses several rows of pins 240, and the second part 200*b* of the circuit board connector 200 houses several rows of sockets 260 adapted to receive the pins 240 when the circuit board 120*a* is slid toward the backplane 110*a* in the shelf 125 (FIG. 1).

Normally, a metal plating 250, usually composed of tin or gold, is deposited on outer surfaces of the pin 240 and the socket 260 to attain an optimal electrical connection between the pin 240 and the socket 260. However, throughout the life of the electronics system 100, the second circuit board 120*a* is repeatedly extracted from the first circuit board 110*a* and either replaced by another second circuit board 120*a* or re-inserted into the first circuit board 110*a*. This repeated contact between the pin 240 and the socket 260 may cause the metal plating 250 to wear away from the pin 240 and the socket 260. Not only does the metal plating 250 wear away from the socket 260, but also the first part of the socket 260*a* and the second part of the socket 260*b* lose their spring tension, causing the electrical connection between the pin 240 and the socket 260 to further weaken. Other sources of wear are (i) chemical or environmental corrosive forces and (ii) debris that cause additional friction during insertion and extraction.

In testing applications where thousands of circuit boards like the second circuit board 120*a* are inserted and extracted from a test interface backplane like the first circuit board 110*a*, it is useful to monitor the pin 240 and the socket 260 for wear. A worn pin 240 or socket 260 can cause false test results.

Referring again to FIG. 2A, in accordance with the present invention, the second circuit board 120*a* includes a monitor 215 connected to a sensor 210, together forming a monitoring system 218. The monitoring system associated with the second circuit board 120*a* is connected to a first part 200*a* of the circuit board connector 200 also associated with the second circuit board 120*a*. Also shown is an embodiment of the first circuit board 110*a*, which includes a monitoring system 218 connected to a second part 200*b* of the circuit board connector 200 associated with the first circuit board 110*a*. Thus, both circuit boards 110*a* and 120*a* include a monitoring system 218 of the present invention to monitor wear of the connector 200.

Each monitoring system 218 may operate independently. In this way, the first circuit board 110*a* can self-monitor the second part 200*b* of the connector if the second circuit board 120*a* is exchanged with another circuit board that is not equipped with a monitoring system 218.

The sensor 210 on the first circuit board 110*a* may be connected to all of the second parts 200*b* of the connectors 200 via a circuit board trace 212. The monitor 215 may keep track of insertion and extraction cycles of each connector 200 individually or in the aggregate for the first circuit board 110*a*.

The sensor 210 senses insertions or extractions of the first part 200*a* of the connector 200 into or out of, respectively, the second part 200*b* of the connector 200. The sensor 210 may employ contact or non-contact techniques (discussed later in reference to FIGS. 6A-6D) for performing this task. The monitor 215 typically receives electrical signals from the sensor 210 and keeps track of (i.e., monitors) the wear of the connector 200 in this manner. For example, a predetermined coefficient may be used to determine physical wear of the plating 250. The monitor 215 may also generate a signal to alert an operator of the system 100 that connector wear has been approached or exceeded. The signal may be an audio signal, visual signal (e.g., LED), or electrical signal (e.g., digital data), such as to cause an 'alert' window to appear on a computer screen.

Figure 2C:
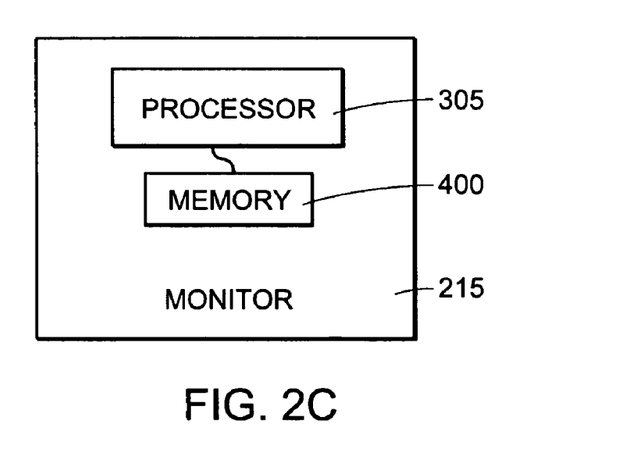
FIG. 2C is a generalized block diagram of the monitor of FIG. 2A.

The monitor 215, as shown in more detail in FIG. 2C, includes a processor 305 which processes signals received from the sensor 210. The monitor 215 also includes memory, such as non-volatile memory 400 located on the processor 305 or off the processor 305, which is connected to the processor and stores data related to the wear of the connector(s) 200. Non-volatile memory 400 protects against losing monitor data due to power failures or disconnection from a power source. For example, the non-volatile memory 400 is useful to have when the metric for wear of a connector is the number of insertion counts, since losing cycle count values leads to inaccurate monitoring. Moreover, the non-volatile memory 400 allows the second circuit boards 120*a* to be disconnected from the first circuit boards 110*a* for an indefinite amount of time and retain knowledge of information related to the wear of the first parts 200*a* of the connector (i.e., independent tracking of each part 200*a*, 200*b* of the connector).

The teachings discussed above with respect to electrical connectors may be applied to optical or mechanical connectors to monitor wear. Respective predetermined thresholds may be used to generate an alarm signal. In cases where electrical power is not inherent with the type of connector being monitored, the monitoring system 218 may use internal (e.g., battery) or external power (e.g., AC power converter).

Figure 2D:
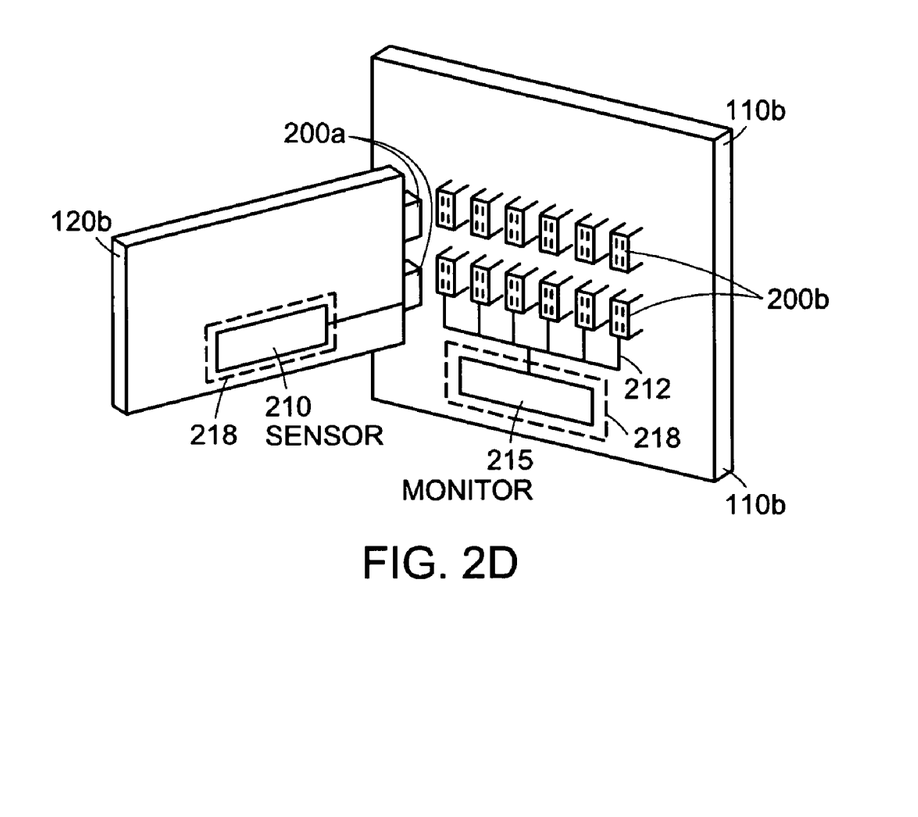
FIG. 2D is a schematic view of the monitoring system of FIG. 2A in which the sensor and monitor are implemented on separate circuit boards.

FIG. 2D illustrates another embodiment of the first circuit board 110*b* and the second circuit board 120*b* in which the first circuit board 110*b* includes the monitor 215 and the second circuit board 120*b* includes the sensor 210. In this embodiment, the sensor 210 is connected to the monitor 215 through the first part 200*a* of the circuit board connector 200, and the monitor 215 is connected to the sensor 210 through the second part 200*b* of the circuit board connector 200.

Figure 2E:
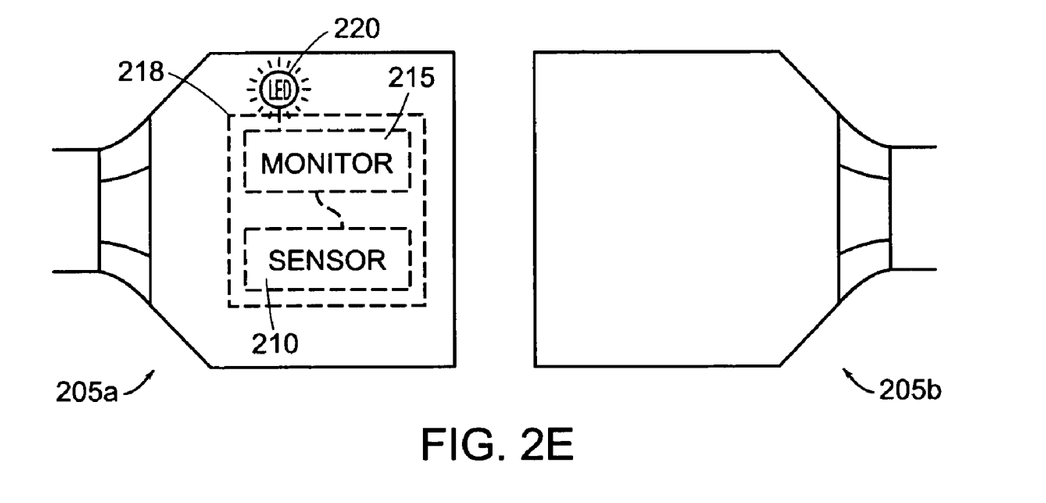
FIG. 2E is a schematic view of the monitoring system of FIG. 2A implemented on a first part of a cable connector connecting to a second part of the cable connector.

The monitoring system 218 may also be employed to monitor wear of a cable connector 205 formed from a first part 205*a* and a second part 205*b* of the cable connector 205. FIG. 2E illustrates such an embodiment in which the first part 205*a* of the cable connector 205 includes the monitoring system 218 to monitor insertions or extractions between the first part 205*a* of the cable connector 205 and the second part 205*b* of the cable connector 205. This embodiment may also include an LED alarm indicator 220 connected to the monitor 215 to indicate whether a threshold number of insertions or extractions has been exceeded.

Figure 2F:
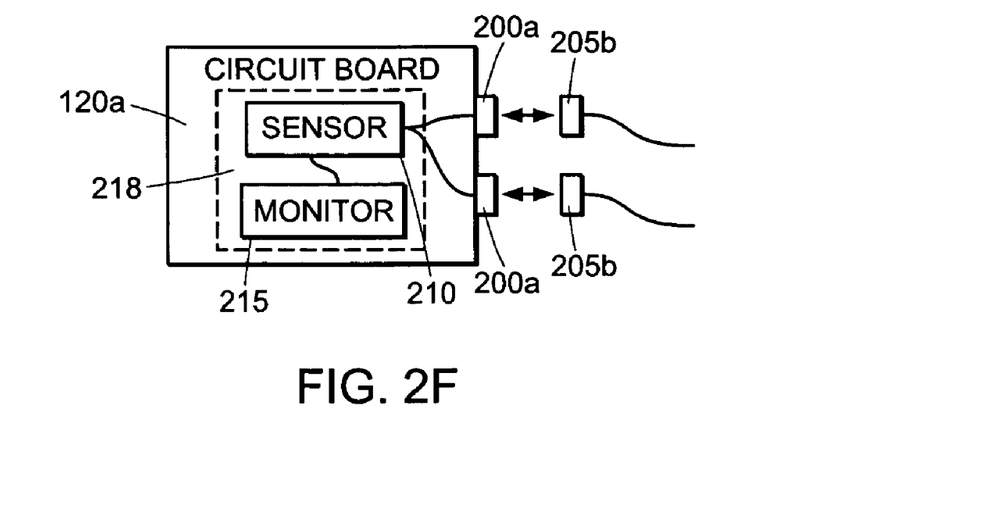
FIG. 2F is a schematic view of the monitoring system of FIG. 2A implemented on a circuit board that connects to cables via connectors.

The monitoring system 218 may further be employed to monitor wear of a connector connecting the circuit board 110*a* or 120*a* to the cable 115. FIG. 2F illustrates such an embodiment in which the second circuit board 120*a* connects to the second part 205*b* of the cable connector 205 through the first part 200*a* of the circuit board connector 200. Thus, the monitoring system 218 monitors wear of a connector formed by the first part 200*a* of the circuit board connector 200 and the second part 205*b* of the cable connector 205.

Figure 2G:
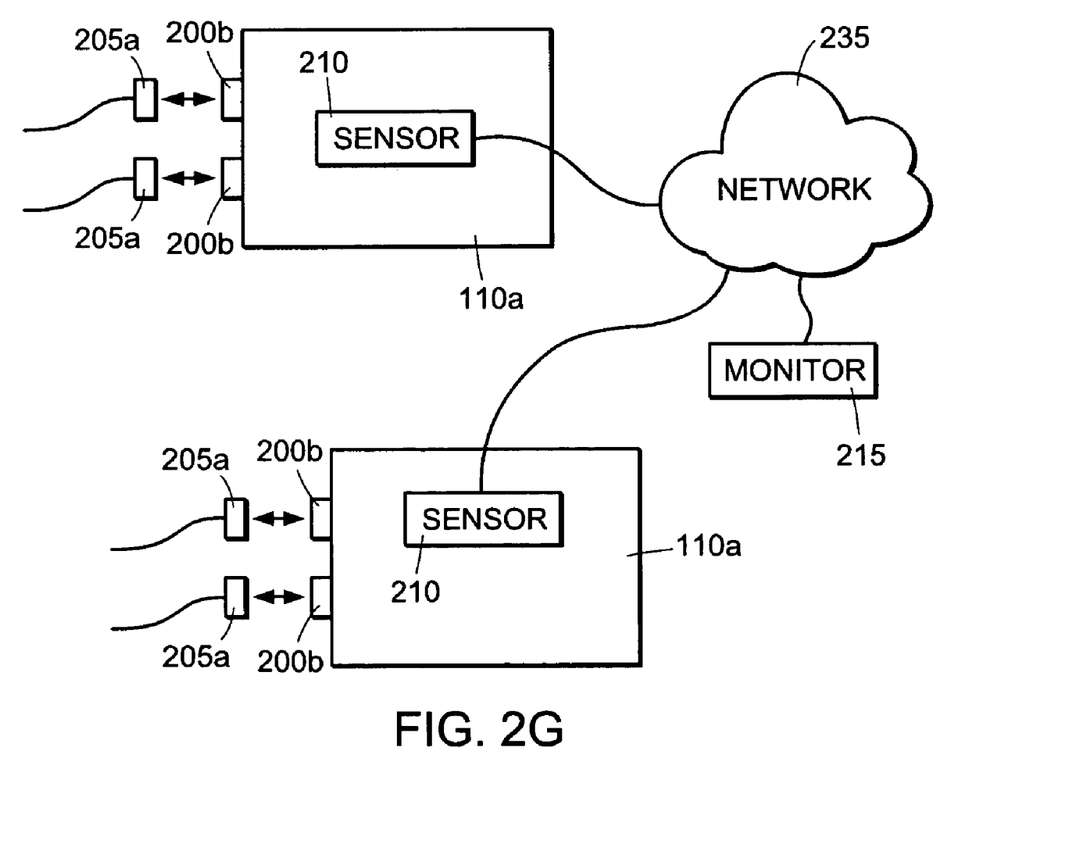
FIG. 2G is a schematic view of the monitoring system of FIG. 2A in which sensors on multiple circuit boards connect to the monitor through a network.

In some applications it may be desirable for one or more sensors 210 to communicate with one or more monitors 215 through a network. FIG. 2G illustrates an embodiment in which sensors 210 located on two respective first circuit boards 110*a* sense insertions or extractions between the first circuit boards 110*a* and the first parts 205*a* of the cable connector 205. The sensors 210 communicate with one monitor 215 through a network 235 using standard network communication techniques. Use of such an embodiment allows for large scale centralized or distributed connector cycle monitoring.

Figure 3:
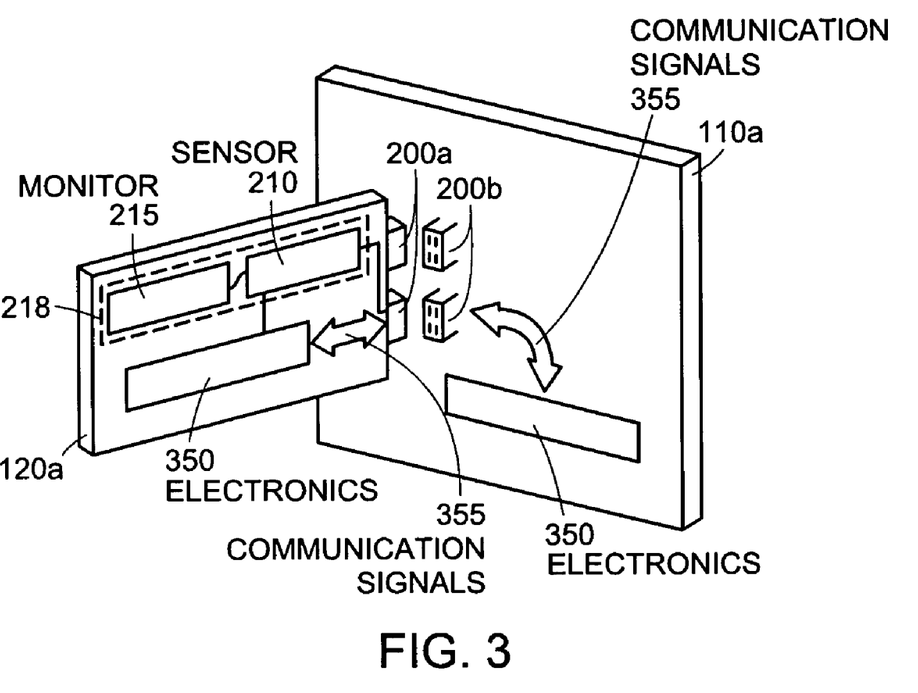
FIG. 3 is a schematic view of the monitoring system of FIG. 2A being independent of circuit board electronics associated with signals communicated through the connector.

Referring to FIG. 3, the monitoring system 218 is independent of circuit board electronics 350 associated with signals 355 communicated through the connector 200 linking the second circuit board 120a to the first circuit board 110a. In another embodiment, the monitoring system 218 may be connected to the circuit board electronics 350 and sense connector wear based on one or more of the signals 355. In yet another embodiment, the monitoring system 218 may be integrated with the circuit board electronics 350.

Figure 4:
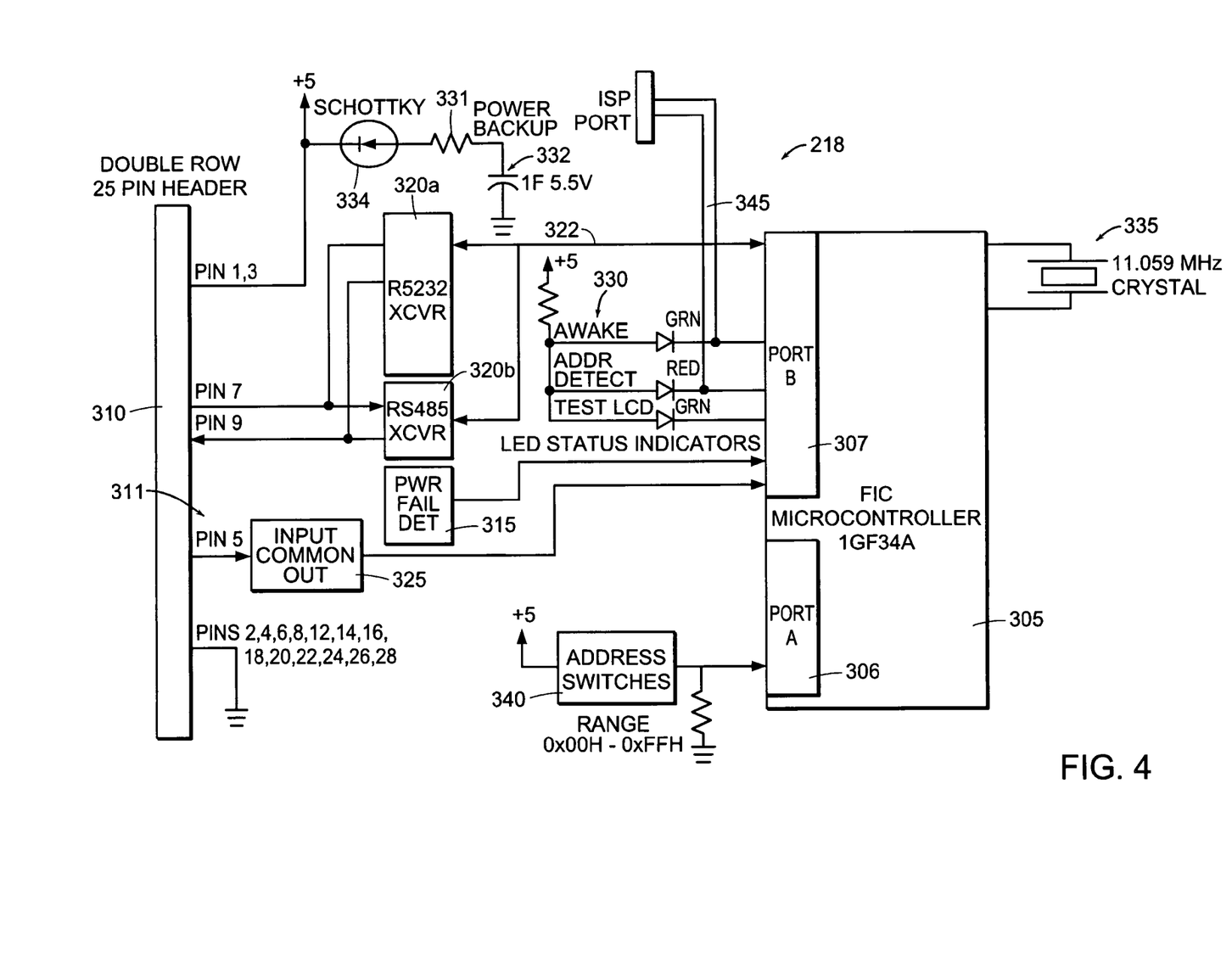
FIG. 4 is a schematic diagram of an embodiment of the monitoring system of FIG. 2A.

FIG. 4 illustrates a circuit block diagram of the monitoring system 218 that connects to the first circuit board 110a. The monitoring system 218 may be constructed on a custom test engineering printed circuit board that connects to the first circuit board 110a via a 28-pin header 310. This embodiment of the monitoring system 218 uses ports 306 and 307 of the processor 305 to interface with the second circuit board 120a via the 28-pin header 310 located on the rear of each first circuit board 110a. Pin 5 at 311 brings in the count signal from the second circuit board 120a. The first circuit board 110a also provides the necessary power and signals to communicate with and control the monitoring system 218.

The second circuit board 120a provides a ground (low) signal when the second circuit board 120a is inserted into the first circuit board 110a. The first circuit board 110a designer may use a MODULE PRESENT signal (not shown) available on some second circuit board 120a designs. If this signal is not available, a digital ground pin on the first part 200a of the circuit board connector 200 associated with the second circuit board 120a may be isolated from ground on the first circuit board 110a and routed to pin 5 at 311 of the monitoring system's 218 28-pin header 310. This signal is routed through the 28-pin header 310 from the first circuit board 110a to a 49.9 ohm series current limit resistor (not shown) contained within a count input conditioning circuit 325. The signal coming from the 49.9 ohm series current limit resistor is pulled high with a 10K ohm pull-up resistor (not shown) and capacitors (not shown), also contained within the count input conditioning circuit 325, which may clamp unwanted transients and filter out spikes that can cause false counts. The output from the count input conditioning circuit 325 is then routed to port A 306 of the processor 305.

Address switches 340 set a HEX address of the monitoring system 218. The HEX address is read by the processor 305 at power-on reset. Any unique address may be chosen in the range of 0x00H to 0xFFH.

A power fail detect circuit 315, such as a DS1811R-10 5V EconoReset IC with an open drain output pulled high via a 10K ohm pull-up resistor, is used to monitor the +5 VDC supply voltage that the first circuit board 110a provides to the monitoring system 218. The output of the power fail detect circuit 315, which is connected to port B 307 of the processor 305, may be set to transition low when +5 VDC falls below 4.35V. This high to low transition causes a hardware interrupt to the processor 305 which saves the current insertion count from RAM (not shown) to the non-volatile memory 400.

An 11.059 MHz crystal clock oscillator 335 may provide a clock signal to the processor 305. Two external capacitors (not shown) may be connected on each side of the crystal to provide increased stability of the oscillator 335. The processor 305 may internally divide the 11.059 MHz clock signal by 4 to provide a 36.2-nanosecond instruction cycle.

Serial communications to and from the processor 305 are made through serial port lines 322 connected to port A 306 and port B 307. Serial communications are level converted to the RS232 standard using an RS232 Integrated Circuit (IC) 320a which is connected to port A 306 and port B 307 through the serial port lines 322. The RS232 IC 320a provides the +/−9 VDC required from an internal charge pump circuit and four external electrolytic filter capacitors (not shown). The transmit and receive signals are routed to the 28-pin header 310 to allow connectivity to the first circuit board 110a directly or are available at an onboard RJ11 jack (not shown). If multiple monitoring systems 218 are required to keep track of the insertions or extractions on multiple first circuit boards 110a, a RS485 transceiver 320b is also connected to the processor 305 via the serial port lines 322 and is available at both the 28-pin header 310 and the RJ11 jack (not shown). Depending on the address switches 340 set on each monitoring system 218, response occurs only on the RS485 transceiver 320b bus when the monitoring system 218 sees its unique address.

The monitoring system 218 may provide three LED status indicators 330 sourced from three processor 305 ports, which are also routed to the 28-pin header 310, so that the first circuit board 110a may read the status directly. An "AWAKE" LED illuminates green when the processor 305 comes out of "sleep" mode. An "ADDR DETECT" LED illuminates red when the monitoring system 218 is communicated with and its own address matches. A "TEST" LED is a spare LED available for debug and future designs.

A firmware program for the monitoring system 218, which may be contained in FLASH memory within the processor 305, may be programmed through the In Circuit Program (ICP) port connector 345. The ICP port connector 345 provides the necessary programming signals from a device programmer to the processor 305 pins. Other types of programming methodologies are also possible, such as storing software in RAM, ROM, or magnetic or optical disk. The processor 305 loads and executes the software in a manner similar to executing the firmware.

When the first circuit board 110a is powered down, +5 VDC is not available until just before the second circuit board 120a is inserted into the first circuit board 110a. If the second circuit board 120a is inserted into the first circuit board 110a before power is applied, then an insertion count is missed. To correct this problem a large value low leakage capacitor 332 may be used to keep power available to the monitoring system 218 from the last insertion. For example, a 1 farad 5.5 VDC rated capacitor 332 and 82 ohm series charge resistor 331 provide 5 VDC to the processor 305. This capacitor 332 charges to approximately VCC (+5 VDC) through the 82-ohm current limit resistor 331. This limits the in-rush current of the capacitor 332 as power is applied. This voltage supplies the processor 305 only through a schottky diode 334. This limits the current draw on the capacitor 332 to the processor 305 for optimum charge time between insertion and extraction cycles. In another embodiment, a battery (not shown) may be employed to provide the backup power.

Figure 5:
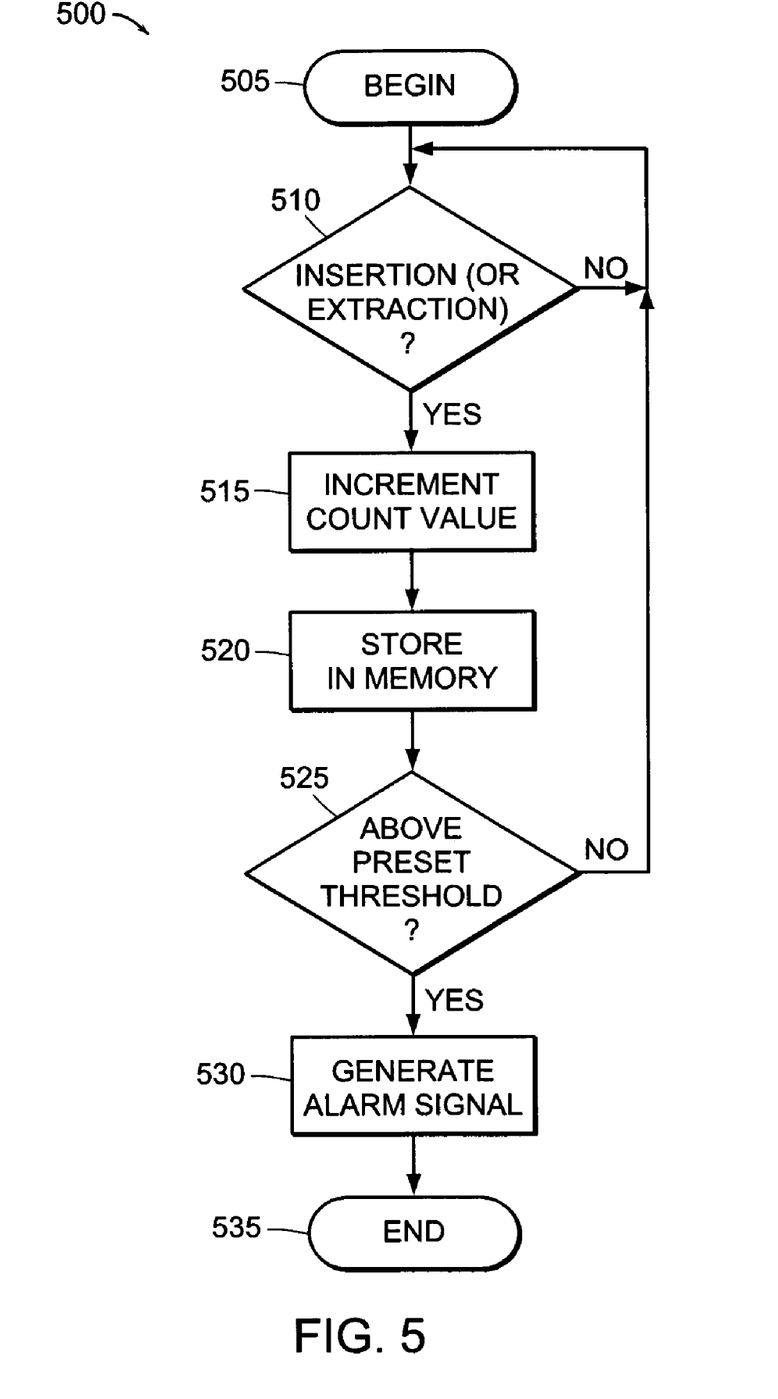
FIG. 5 is a flowchart illustrating example steps that the monitor of FIG. 2A performs to monitor insertions or extractions.

FIG. 5 is a flowchart of a process 500 executed by the processor 305 that monitors wear of a connector. The process 500 begins in step 505 where a count value is initialized to zero or a prior value. In step 510, the process 500 determines from sensed information received from the sensor 210 whether an insertion or extraction has occurred. If the process 500 determines that an insertion or extraction has occurred, then the process continues to step 515. Otherwise, the process 500 repeats step 510. In step 515, the process 500 increments the count value. In step 520, the process 500 stores the new count value in non-volatile memory 400. In step 525, the process 500 determines whether the count value is above a predetermined or preset threshold. The preset threshold may equal the average number of insertion and extraction cycles at which wear of the connector can cause a poor electrical connection. If the count value does not exceed the preset threshold, then the process 500 returns to step 510. Otherwise, the process 500 continues to step 530 in which the process 500 generates an alarm signal. After step 530 the process 500 ends in step 535.

Various sensors 210 associated with various metrics may be used to estimate wear of a connector. The metric used in one embodiment is the number of insertion and extraction cycles. One way to count insertions or extractions is through an electrical sensing configuration 600, shown in FIG. 6A, in which the sensor 210 receives a 'high' or 'low' signal through a spare pin 605 for each insertion or extraction. Another way to count insertions or extractions is through a mechanical sensing configuration 625, shown in FIG. 6B, in which an extraction or insertion between the second circuit board 120*a* and the first circuit board 110*a* triggers a spring loaded switch 630 which sends a signal to the sensor 210. Non-contact sensing configurations may also be employed such as a capacitive sensing configuration 650, shown in FIG. 6C, in which the sensor 210 senses a threshold capacitance between a first plate of a capacitor 655*a* associated with the first circuit board 110*a* and a second plate of a capacitor 655*b* associated with the second circuit board 120*a*. Another non-contact sensing configuration is an optical sensing configuration 675, shown in FIG. 6D, in which a transmitter 682 associated with the second circuit board 120*a* sends an optical signal 685 directed to a mirror 680 associated with the first circuit board 110*a*. A receiver 684 also associated with the second circuit board 120*a* receives the optical signal 685 from the mirror 680. The optical signal 685 changes during insertions or extractions.

Figure 6A:
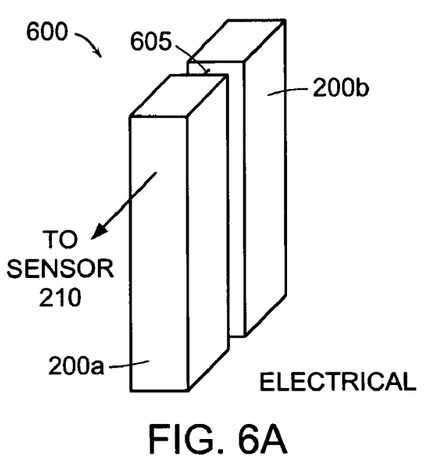
FIGS. 6A and 6B are schematic views of contact sensing configurations of the monitoring system of FIG. 2A.
Figure 6B:
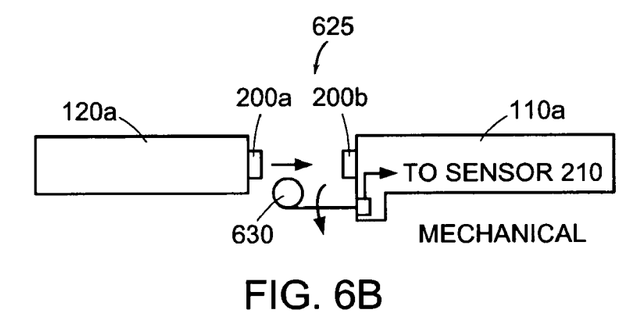
Figure 6C:
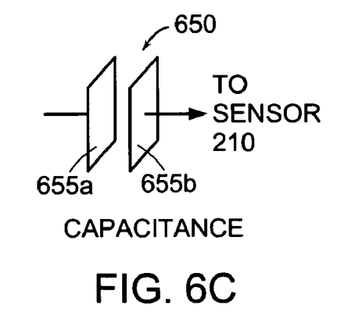
FIGS. 6C and 6D are schematic views of non-contact sensing configurations of the monitoring system of FIG. 2A.
Figure 6D:
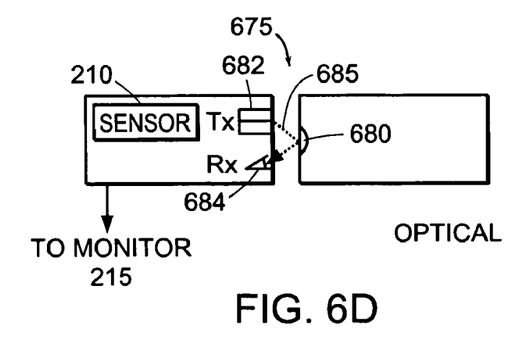

Other metrics beyond those just discussed may be employed to determine wear of a connector. Examples of other metrics include the impedance between the spare pin 605 and the corresponding socket 260, the deflection of the first part of the socket 260*a* and the second part of the socket 260*b*, and the resistance between the spare pin 605 and the corresponding socket 260.

While this invention has been particularly shown and described with references to preferred embodiments thereof, it will be understood by those skilled in the art that various changes in form and details may be made therein without departing from the scope of the invention encompassed by the appended claims.

What is claimed is:

1. An apparatus for monitoring wear of a connector having first and second parts, the apparatus comprising:
    a sensor including sensing electronics to sense insertions or extractions of the first part of the connector with the second part of the connector, the insertion or extraction being associated with wear of the connector and the sensing electronics being independent of electronics associated with signals communicated through the connector; and
    a monitor responsive to the sensor to monitor the wear of the connector.

2. The apparatus according to claim 1 wherein the sensor includes contact or non-contact sensor elements to sense insertions or extractions.

3. The apparatus according to claim 1 wherein the sensing electronics further determines a metric associated with the connector to estimate the wear of the connector.

4. The apparatus according to claim 1 wherein the monitor is coupled to the sensor via a network.

5. The apparatus according to claim 1 wherein the monitor includes:
    a processor to process signals received from the sensor; and memory coupled to the processor to store data related to the processed signals.

6. The apparatus according to claim 5 wherein the processor counts the insertion and extraction cycles.

7. The apparatus according to claim 5 wherein the memory is non-volatile memory.

8. The apparatus according to claim 5 wherein the processor generates an alarm signal.

9. The apparatus according to claim 1 (i) wherein the sensor and monitor are deployed on a first circuit board, (ii) wherein the sensor and monitor are deployed on a second circuit board interconnecting to the first circuit board, (iii) wherein the sensor and monitor are deployed on at least one of the parts of the connector, or (iv) wherein the sensor is deployed on the first circuit board and the monitor is deployed on the second circuit board coupled to the first circuit board directly, indirectly, or via a network.

10. A method for monitoring wear of a connector having first and second parts, the method comprising:
    sensing insertion or extraction of the first part of the connector with the second part of the connector, sensing the insertion or extraction being independent of communicating signals through the connector and being associated with the wear of the connector; and
    monitoring the wear of the connector based on the sensing.

11. The method according to claim 10 wherein sensing the insertions or extractions includes sensing via contact or non-contact techniques.

12. The method according to claim 10 further including determining a metric associated with the performance of the connector to estimate the wear of the connector.

13. The method according to claim 10 wherein the monitoring is associated with the sensing via a network.

14. The method according to claim 10 wherein the monitoring includes:
    processing signals associated with the sensing; and
    storing data related to the processed signals.

15. The method according to claim 14 wherein the processing includes counting the insertions or extractions.

16. The method according to claim 14 wherein the data is stored in a non-volatile manner.

17. The method according to claim 14 wherein the processing includes generating an alarm signal.

18. The method according to claim 10 (i) wherein the sensing and monitoring occur on a first circuit board, (ii) wherein the sensing and monitoring occur on a second circuit board interconnecting to the first circuit board, (iii) wherein the sensing and monitoring occur on at least one of the parts of the connector, or (iv) wherein the sensing occurs on the first circuit board and the monitoring occurs on the second circuit board coupled to the first circuit board directly, indirectly, or via a network.

19. An apparatus for monitoring wear of a connector including first and second parts, the apparatus comprising:
    means for sensing insertions or extractions of the first part of the connector with the second part of the connector, the sensing being independent of communicating signals through the connector, the insertions or extractions being associated with the wear of the connector; and
    means for monitoring the wear of the connector based on the sensing.

20. A system, comprising:
a connector including a first part and a second part;
a sensor, including sensing electronics independent of electronics associated with signals communicated through the connector, coupled to at least one of the parts of the connector and sensing an insertion or extraction of the first part of the connector with the second part of the connector, the insertions or extractions being associated with wear of the connector; and
a monitor coupled to at least one of the parts of the connector and to the sensor to track the wear of the connector.

21. An apparatus for monitoring wear of a connector having first and second parts, the apparatus comprising:
a sensor configured to sense an insertion or extraction of first part of the connector with the second part of the connector, the insertions or extractions being associated with the wear of the connector; and
a monitor responsive to the sensor to monitor the wear of the connector;
the sensor and monitor being deployed (i) on a first circuit board, (ii) on a second circuit board interconnecting to the first circuit board, (iii) on at least one of the parts of the connector, or (iv) the sensor is deployed on the first circuit board and the monitor is deployed on the second circuit board coupled to the first circuit board directly, indirectly, or via a network.

22. The apparatus according to claim 21 wherein the sensor includes contact or non-contact sensor elements to sense insertions or extractions.

23. The apparatus according to claim 21 wherein the sensor includes sensing electronics to sense insertions or extractions, the sensing electronics being independent of electronics associated with the signals communicated through the connector.

24. The apparatus according to claim 23 wherein the sensing electronics are configured to determine a metric associated with the connector to estimate the wear of the connector.

25. A method for monitoring wear of a connector having first and second parts, the method comprising:
sensing insertion or extractions of the first part of the connector with the second part of the connector, the insertions or extractions being associated with the wear of the connector;
monitoring the wear of the connector based on the sensing;
the sensing and monitoring occurs (i) on a first circuit board, (ii) on a second circuit board interconnecting to the first circuit board, (iii) on at least one of the parts of the connector, or (iv) in the sensing occurs on the first circuit board and the monitoring occurs on the second circuit board coupled to the first circuit board directly, indirectly, or via a network.

26. The method according to claim 25 wherein sensing the insertions or extractions include sensing via contact or non-contact techniques.

27. The method according to claim 25 wherein sensing the insertions or extractions is independent of signals communicated through the connector.

28. The method according to claim 27 further including determining a metric associated with the performance of the connector to estimate the wear of the connector.

* * * * *